US012671104B2

(12) United States Patent (10) Patent No.: US 12,671,104 B2
Patil et al. (45) Date of Patent: Jun. 30, 2026

(54) BATTERY PACK FOR A VEHICLE AND METHODS AND SYSTEMS FOR MAKING THE SAME

(71) Applicant: GM GLOBAL TECHNOLOGY OPERATIONS LLC, Detroit, MI (US)

(72) Inventors: Chinmaya Patil, South Lyon, MI (US); John Patrick Spicer, Plymouth, MI (US); Miguel Arturo Saez, Clarkston, MI (US); Madhusudan Raghavan, West Bloomfield, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 717 days.

(21) Appl. No.: 18/153,511

(22) Filed: Jan. 12, 2023

(65) Prior Publication Data

US 2024/0243331 A1 Jul. 18, 2024

(51) Int. Cl.
*G01R 31/389* (2019.01)
*G01R 31/385* (2019.01)
*G01R 31/396* (2019.01)
*H01M 10/04* (2006.01)
*H01M 10/42* (2006.01)
*H01M 10/48* (2006.01)
*H01M 50/509* (2021.01)

(52) U.S. Cl.
CPC .... *H01M 10/0404* (2013.01); *G01R 31/3865* (2019.01); *G01R 31/389* (2019.01); *G01R 31/396* (2019.01); *H01M 10/42* (2013.01); *H01M 10/4285* (2013.01); *H01M 10/48* (2013.01); *H01M 50/509* (2021.01)

(58) Field of Classification Search
CPC ............... G01R 31/389; H01M 10/42; H01M 10/4285; H01M 10/48
See application file for complete search history.

(56) References Cited

FOREIGN PATENT DOCUMENTS

DE 102011101793 A1 * 11/2012 .......... H01M 10/482
EP 3940863 A1 * 1/2022 .......... H01M 50/289

* cited by examiner

*Primary Examiner* — Kevin E Yoon
(74) *Attorney, Agent, or Firm* — CANTOR COLBURN LLP

(57) ABSTRACT

Embodiments include a method for creating a battery pack for a vehicle. Aspects include receiving a plurality of battery cells, measuring an internal resistance level for each of the plurality of battery cells, and creating, based at least in part on the internal resistance level for each of the plurality of battery cells, a plurality of groups from the plurality of battery cells. Aspects also include connecting each of the plurality of battery cells in each of the plurality of groups in parallel and connecting each of the plurality of groups in series.

18 Claims, 8 Drawing Sheets

BATTERY PACK FOR A VEHICLE AND METHODS AND SYSTEMS FOR MAKING THE SAME

INTRODUCTION

The subject disclosure relates to electric vehicles. In particular, the invention relates to a battery pack of an electric vehicle and methods and systems for making the same.

Electric vehicles include battery packs that include several battery cells that are often connected in a configuration that includes both series and parallel connections. In large-capacity batteries made from a multitude of small cells, it is common for subgroups of cells to be connected in parallel. In general, each battery cell has an internal resistance. The variation of the internal resistances among battery cells that are connected in parallel negatively affects the performance of subgroups and the battery pack by reducing the usable energy.

SUMMARY

In one exemplary embodiment, a method for creating a battery pack for a vehicle is provided. The method includes receiving a plurality of battery cells, measuring an internal resistance level for each of the plurality of battery cells, and creating, based at least in part on the internal resistance level for each of the plurality of battery cells, a plurality of groups from the plurality of battery cells. The method also includes connecting each of the plurality of battery cells in each of the plurality of groups in parallel and connecting each of the plurality of groups in series.

In addition to one or more of the features described herein, creating the plurality of groups from the plurality of battery cells includes ordering the plurality of battery cells by the internal resistance level for each of the plurality of battery cells and selecting a number of adjacently ranked battery cells as a group.

In addition to one or more of the features described herein, at least one of the plurality of battery cells is not included in any of the plurality of groups.

In addition to one or more of the features described herein, the at least one of the plurality of battery cells includes a battery cell of the plurality of battery cells having a highest internal resistance level and a battery cell of the plurality of battery cells having a lowest internal resistance level.

In addition to one or more of the features described herein, the plurality of groups from the plurality of battery cells are created such that a standard deviation of the internal resistance level for each of the plurality of groups is minimized.

In addition to one or more of the features described herein, each of the plurality of groups includes a same number of battery cells.

In addition to one or more of the features described herein, creating a group of the plurality of groups includes placing the plurality of battery cells corresponding to the group adjacent to one another.

In addition to one or more of the features described herein, the method also includes placing a group of the plurality of groups that has a highest internal resistance in a center of the battery pack.

In addition to one or more of the features described herein, the method also includes placing a group of the plurality of groups that has a lowest internal resistance at an edge of the battery pack.

In another exemplary embodiment, system for creating a battery pack for a vehicle is provided. The system includes a first robotic arm configured to obtain a plurality of battery cells and a first tool configured to measure an internal resistance level of each of the plurality of battery cells. The system also includes a second robotic arm configured to control a placement of each of the plurality of battery cells in the battery pack and a controller configured to operate the first robotic arm, the first tool and the second robotic arm. The controller is configured to create a plurality of groups from the plurality of battery cells, based on the internal resistance level for each of the plurality of battery cells. The placement of each of the plurality of battery cells in the battery pack is determined based on the plurality of groups.

In addition to one or more of the features described herein, the plurality of groups are created by ordering the plurality of battery cells by the internal resistance level for each of the plurality of battery cells and selecting a number of adjacently ranked battery cells as a group.

In addition to one or more of the features described herein, at least one of the plurality of battery cells is not included in any of the plurality of groups.

In addition to one or more of the features described herein, the at least one of the plurality of battery cells includes a battery cell of the plurality of battery cells having a highest internal resistance level and a battery cell of the plurality of battery cells having a lowest internal resistance level.

In addition to one or more of the features described herein, the plurality of groups from the plurality of battery cells are created such that a standard deviation of the internal resistance level for each of the plurality of groups is minimized.

In addition to one or more of the features described herein, each of the plurality of groups includes a same number of battery cells.

In addition to one or more of the features described herein, the first robotic arm is configured to obtain the plurality of battery cells from an automated guided vehicle that is controlled by the controller.

In addition to one or more of the features described herein, the placement includes placing a group of the plurality of groups that has a highest internal resistance in a center of the battery pack.

In addition to one or more of the features described herein, the placement includes placing a group of the plurality of groups that has a lowest internal resistance at an edge of the battery pack.

In another exemplary embodiment, a battery pack for an electric vehicle is provided. The battery pack includes a first group of battery cells connected to each other in parallel, a second group of battery cells connected to each other in parallel, and a third group of battery cells connected to each other in parallel. The first group of battery cells, the second group of battery cells and the third group of battery cells are connected to each other in series. The internal resistance level of each battery in the first group of battery cells is lower than a minimum internal resistance level of the second group of battery cells. The internal resistance level of each battery in the third group of battery cells is greater than a maximum internal resistance level of the second group of battery cells.

In addition to one or more of the features described herein, the third group of battery cells is disposed between the first group of battery cells and the second group of battery cells.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

The following description is merely exemplary in nature and is not intended to limit the present disclosure, its application or uses.

In accordance with an exemplary embodiment, a battery pack having a plurality of battery cells is provided. The plurality of battery cells of the battery pack are configured in a plurality of groups. Each group includes battery cells connected to each other in parallel and the groups are connected to each other in series. In exemplary embodiments, the groups of battery cells are created, based at least in part on the internal resistance level for each of the plurality of battery cells, such that a variance of the internal resistance of the battery cells for each group is minimized. In exemplary embodiments, by minimizing the variance of the internal resistance of the battery cells for each group the performance of the battery pack is improved.

Figure 1:
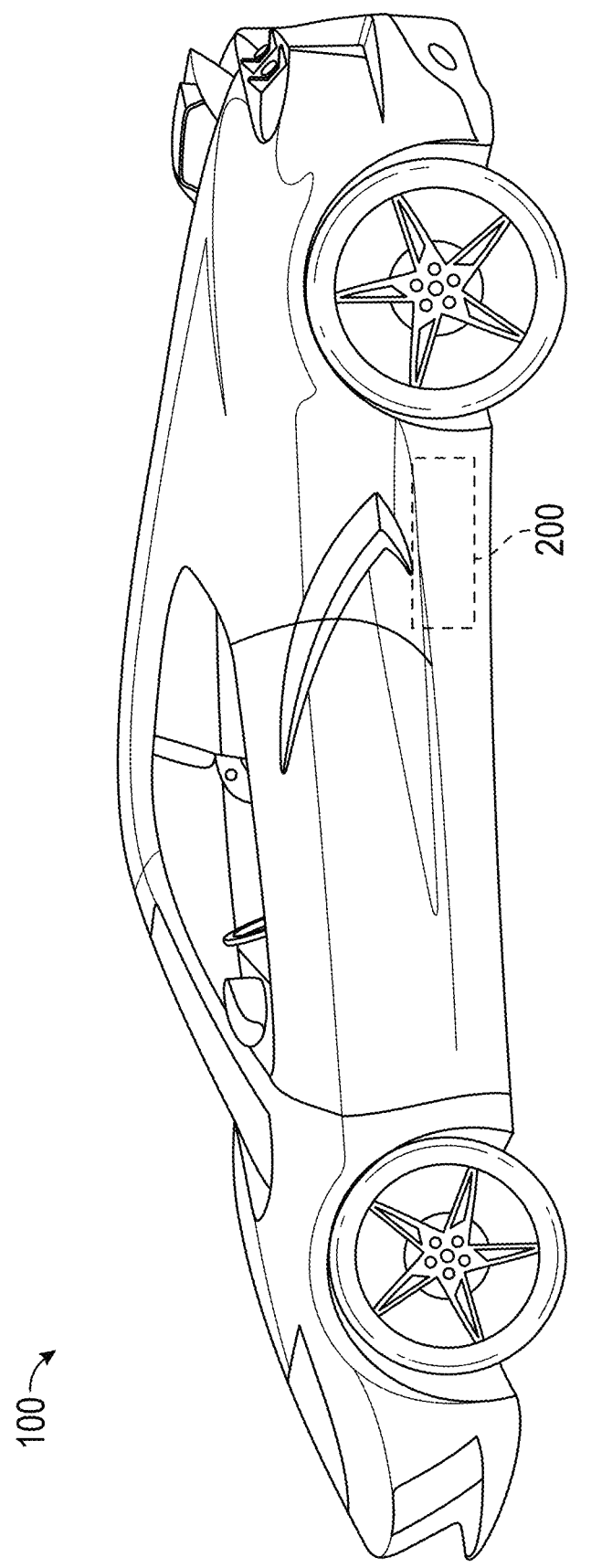
FIG. 1 is a schematic diagram of a vehicle for use in conjunction with one or more embodiments of the present disclosure.

Referring now to FIG. 1, a schematic diagram of a vehicle 100 for use in conjunction with one or more embodiments of the present disclosure is shown. The vehicle 100 includes a battery pack 200. In one embodiment, the vehicle 100 is a hybrid vehicle that utilizes both an internal combustion engine and an electric motor. In another embodiment, the vehicle 100 is an electric vehicle that only utilizes electric motors.

Figure 2:
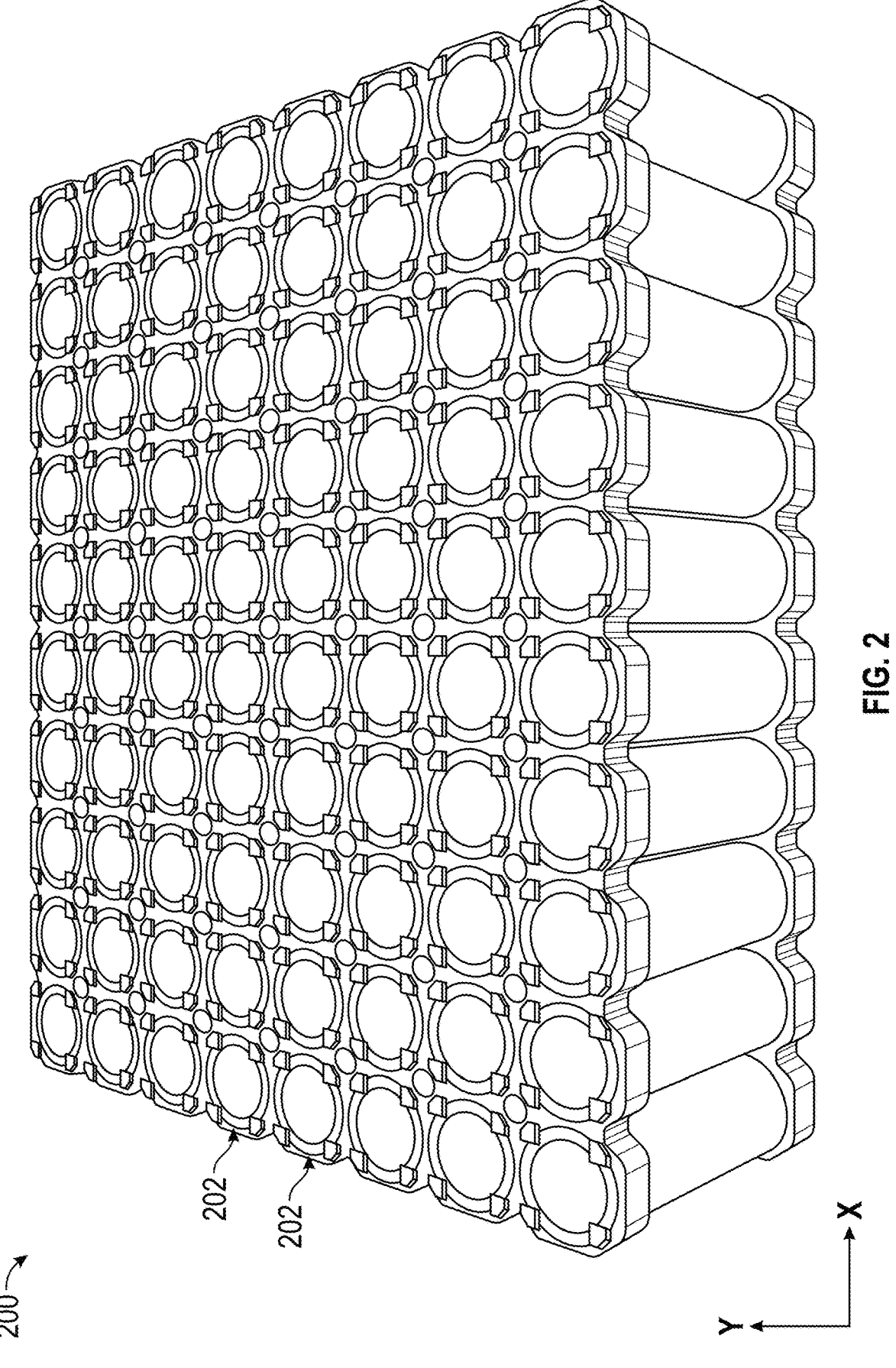
FIG. 2 is a schematic diagram of a battery pack for use in conjunction with one or more embodiments of the present disclosure.

Referring now to FIG. 2, a schematic diagram of a battery pack 200 for use in conjunction with one or more embodiments of the present disclosure is shown. As illustrated, the battery pack 200 includes a plurality of battery cells 202. In one embodiment, the plurality of battery cells 202 are grouped into eight serially connected groups that each contain ten cells that are connected in a parallel configuration. In one embodiment, each group of battery cells 202 extends along a row in the x-direction. In exemplary embodiments, the plurality of battery cells 202 of the battery pack 200 are connected to each other via one or more collector plates (not shown).

Figure 3:
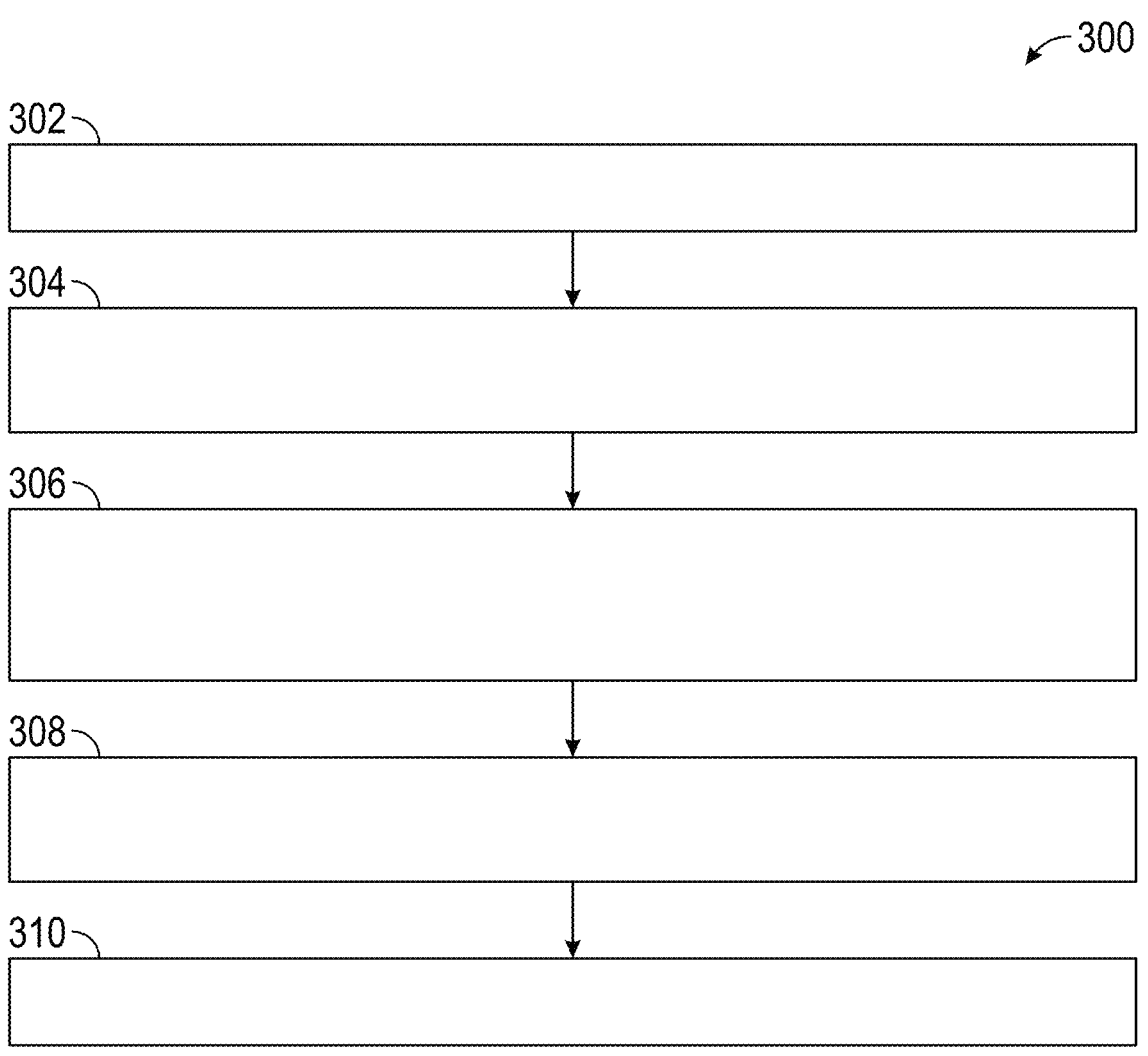
FIG. 3 is a flowchart diagram of a method for creating a battery pack for a vehicle in accordance with one or more embodiments of the present disclosure.

Referring now to FIG. 3, a flowchart diagram of a method 300 for creating a battery pack for a vehicle in accordance with one or more embodiments of the present disclosure is shown. At block 302, the method 300 begins by receiving a plurality of battery cells. Next, at block 304, the method 300 includes measuring an internal resistance level for each of the plurality of battery cells. Once the internal resistance level for each of the plurality of battery cells has been measured, the method 300 includes creating, based at least in part on the internal resistance level for each of the plurality of battery cells, a plurality of groups from the plurality of battery cells, at block 306. In one embodiment, the plurality of groups are created from the plurality of battery cells such that a standard deviation of the internal resistance level for each of the plurality of groups is minimized.

In exemplary embodiments, creating the plurality of groups from the plurality of battery cells includes ordering the plurality of battery cells by the internal resistance level for each of the plurality of battery cells and selecting a number of adjacently ranked battery cells as a group. In one embodiment, at least one of the plurality of battery cells is not included in any of the plurality of groups. For example, the battery cell of the plurality of battery cells having a highest internal resistance level and/or the battery cell of the plurality of battery cells having a lowest internal resistance level may not be included in any of the plurality of groups In one example, the plurality of battery cells includes one hundred and ten battery cells which are ranked based on their measured internal resistance levels. In this example, the battery cells with the top five and bottom five rankings are not included in any of the groups and ten groups of ten battery cells are created based on the rankings. For example, one group includes battery cells ranked six through fifteen, another group includes battery cells ranked sixteen through twenty-five, and so on. In exemplary embodiments, each of the plurality of groups includes the same number of battery cells.

In exemplary embodiments, creating a group of the plurality of groups includes placing the plurality of battery cells corresponding to the group adjacent to one another. At block 308, the method 300 includes connecting each of the plurality of battery cells in each of the plurality of groups in parallel. The method 300 concludes at block 310 by connecting each of the plurality of groups in series.

Figure 4:
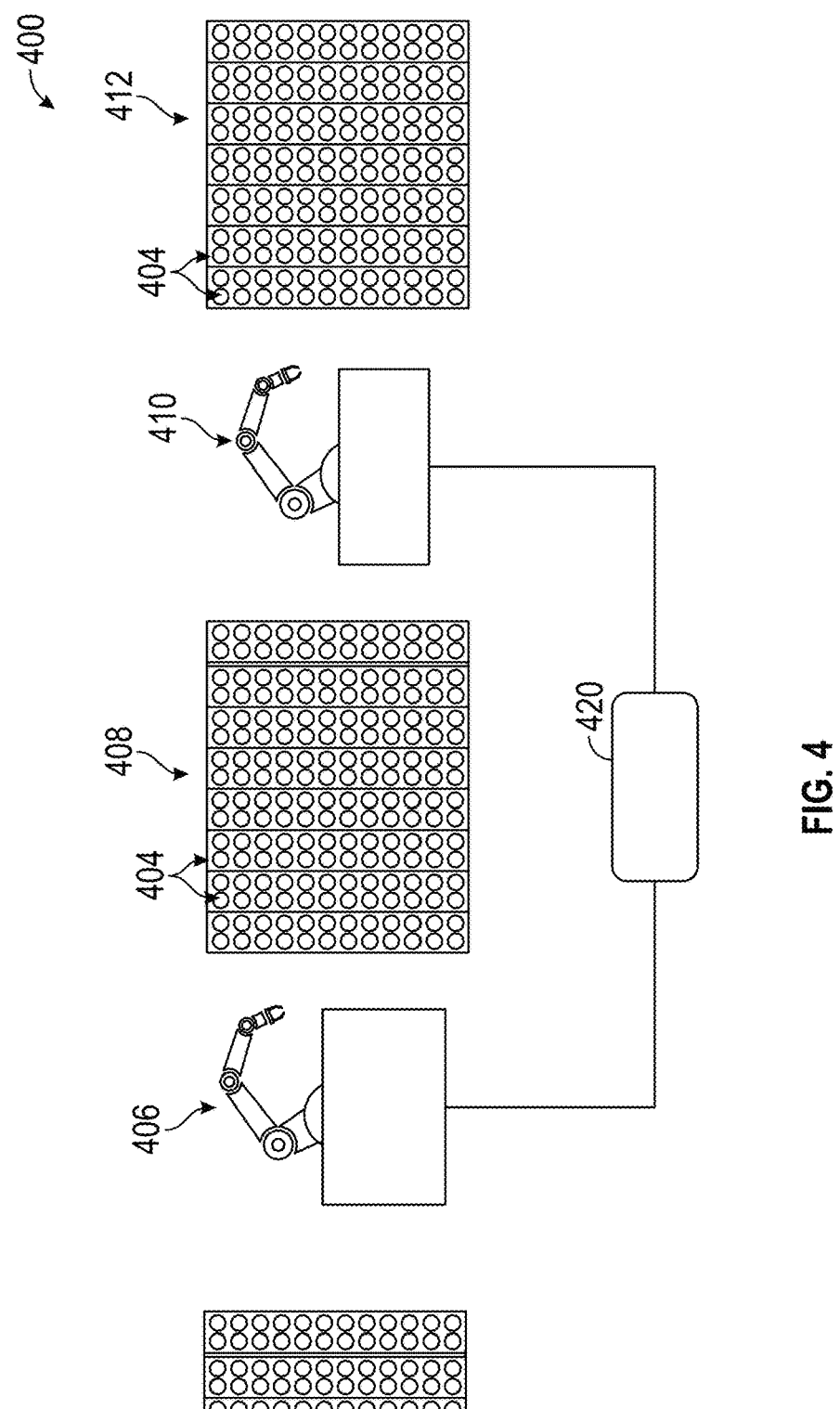
FIG. 4 is a schematic diagram of a system for creating a battery pack for a vehicle in accordance with one or more embodiments of the present disclosure.

Referring now to FIG. 4 a schematic diagram of a system 400 for creating a battery pack for a vehicle in accordance with one or more embodiments of the present disclosure is shown. The system 400 includes a first tray 402 of battery cells 404 that have not been sorted or tested. The system 400 also includes a first robotic arm 406 that is configured to remove one or more battery cells 404 from the first tray 402 and place the one or more battery cells 404 into a second tray 408. In exemplary embodiments, the first robotic arm 406 includes a tool configured to test the internal resistance of the one or more battery cells 404. In exemplary embodiments, the first robotic arm 406 is operated by a controller 420. The controller 420 may be a general-purpose processor, a discrete logic circuit(s) having logic gates for implementing logic functions upon data signals, an application-specific integrated circuit (ASIC) having appropriate combinational logic gates, a programmable gate array(s) (PGA), a field programmable gate array (FPGA), etc. In exemplary embodiments, the controller 420 is configured to store the measured internal resistance of the battery cells 404 and the location in the second tray 408 of each of the battery cells 404.

In exemplary embodiments, after all of the battery cells 404 have been removed from the first tray 402, had their internal resistance tested, and placed into the second tray 408, the controller 420 ranks the battery cells 404 by their internal resistance. The controller 420 is further configured to divide the battery cells 404 into a plurality of groups based on their internal resistance and/or their ranking. In exemplary embodiments, the plurality of groups are created such that a variance of the internal resistance among the battery cells of the group is minimized. In some embodiments, not all of the battery cells 404 in the second tray 408 are included in the plurality of groups. For example, one or more battery cells 404 that have either the highest or lowest internal resistance values/ranking may not be included in one of the plurality of groups.

Once the controller 420 has created the plurality of groups of battery cells 404, the controller 420 instructs a second robotic arm 410 to pick and place the battery cells 404 into a third tray 412, which is used to form the battery pack. In one embodiment, the battery cells of each group are placed into a single row or column in the third tray 412. Once all of the battery cells 404 of the plurality of groups have been placed in the third tray 412 each of the plurality of battery cells in each of the plurality of groups are connected in parallel and the plurality of groups are connected in series.

Figure 5:
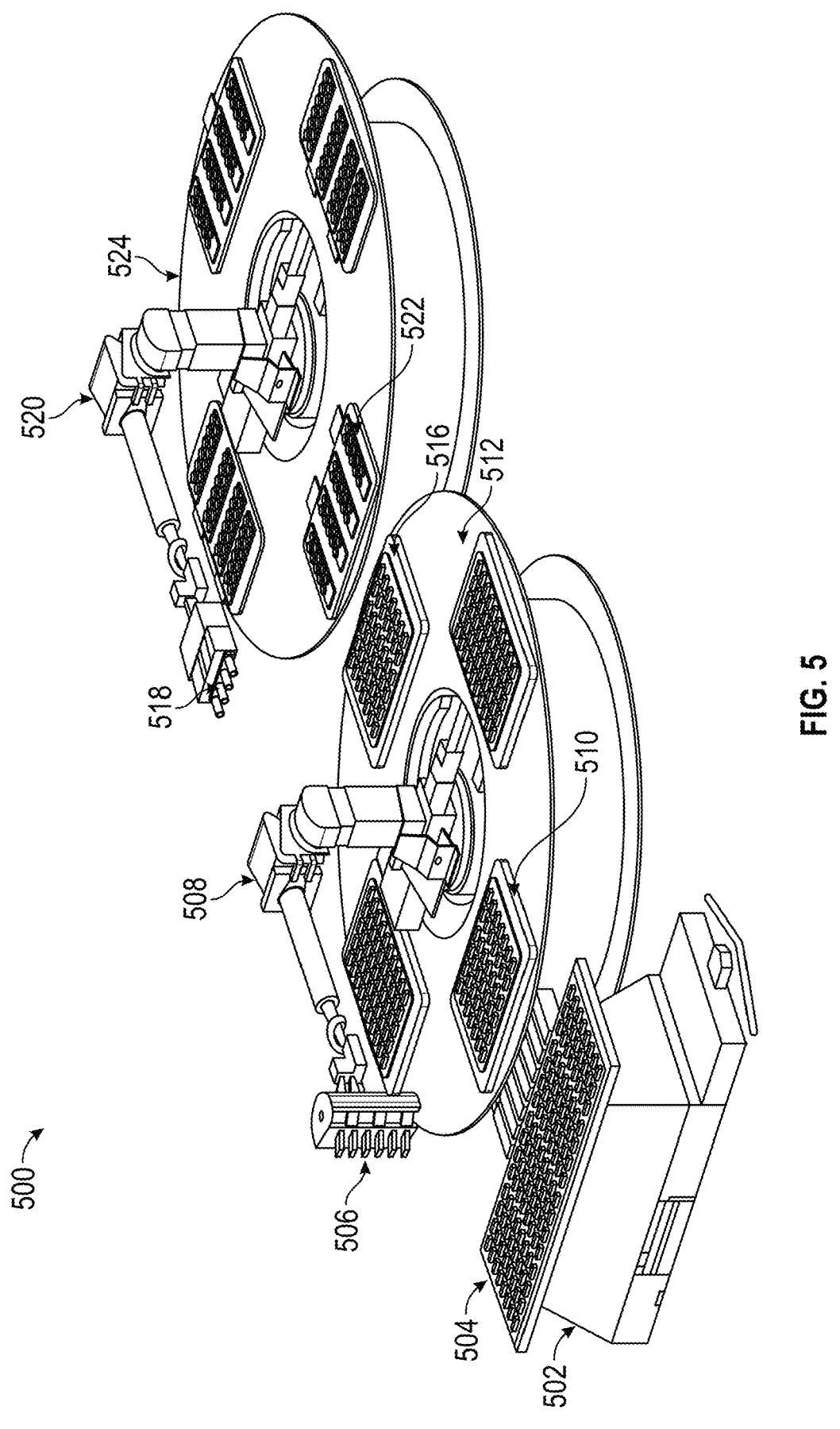
FIG. 5 is a schematic diagram of another system for creating a battery pack for a vehicle in accordance with one or more embodiments of the present disclosure.

Referring now to FIG. 5, a schematic diagram of a system 500 for creating a battery pack for a vehicle in accordance with one or more embodiments of the present disclosure is shown. As illustrated, the system includes an automated guided vehicle (AGV) 502 that is configured to bring a first tray 504 of battery cells to a first location adjacent a table 512. Once the AGV 502 is in place, a first robotic arm 508 is configured to use tool 506 to remove the battery cells from the first tray 504 and place the battery cells onto a second tray 510 located on the table 512. In exemplary embodiments, the tool 506 is further configured to measure the internal resistance of each of the battery cells before placing the battery cells into the second tray 510. In one embodiment, each battery cell includes a unique bar code that the tool 506 scans and the tool transmits the bar code, a measured internal resistance, and a location where each battery cell is placed in the second tray 510 to a controller (not shown). Once the second tray 510 is full, the table 512 rotates and the process of picking, testing, and placing the battery cells restarts.

The system 500 also includes a second robotic arm 520 that includes a second tool 518 that is configured to pick battery cells from tray 516 and place them in tray 522. In exemplary embodiments, the second robotic arm 520 is operated by a controller, which controls the location where the battery cells are placed in the tray 522. In one embodiment, the battery cells are divided into groups based on their internal resistance, and the second robotic arm 520 and second tool 518 place the battery cells into locations on the second tray based on their assigned group. Once all of the battery cells have been placed into the tray 522, the table 524 rotates and the battery pack is prepared for assembly. In exemplary embodiments, one or more controllers are configured to operate and coordinate the operation of, the AGV 502, the tool 506, the first robotic arm, the table 512, the second robotic arm 520, the second tool, and the table 524.

Figure 6:
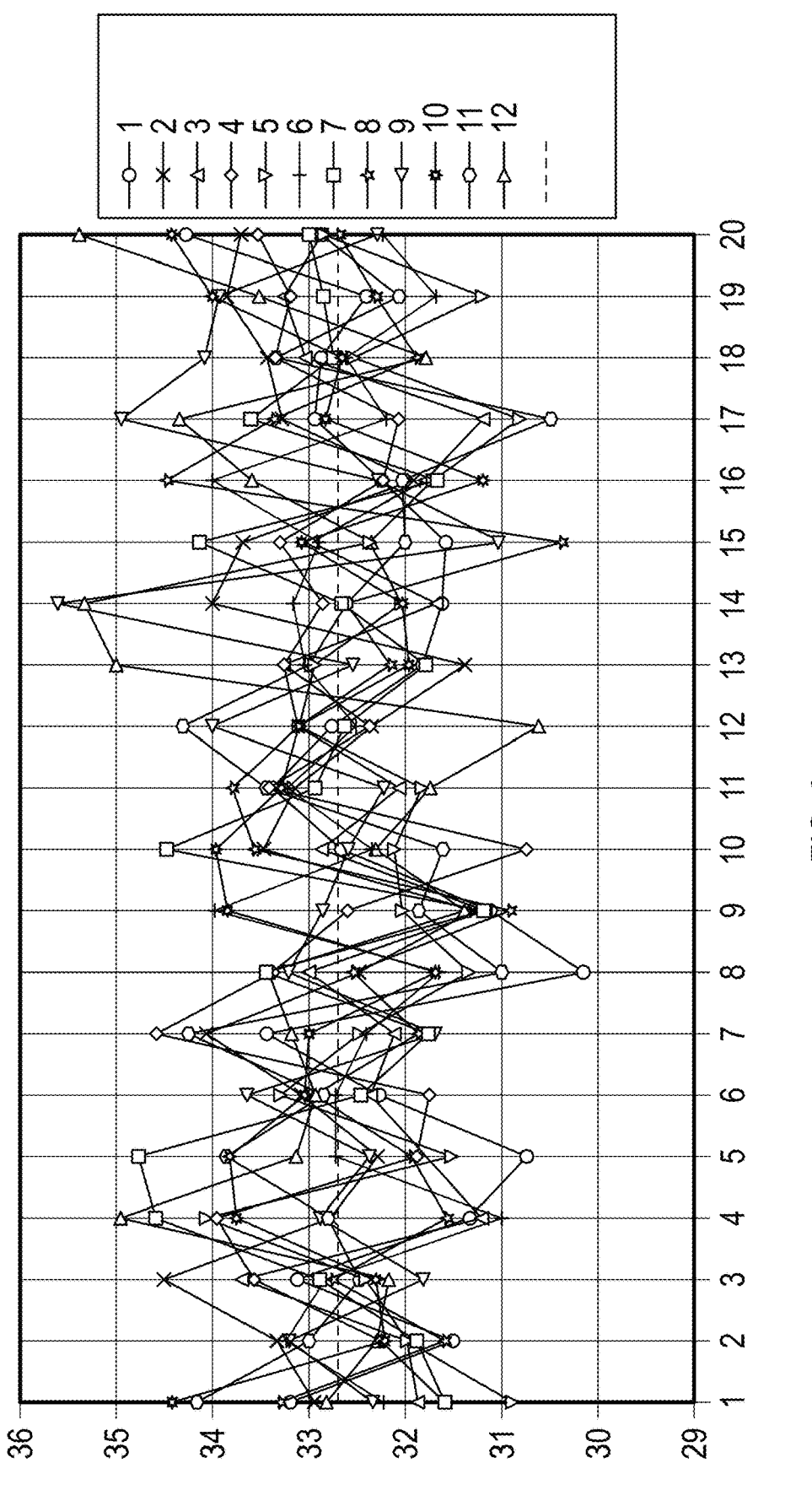
FIG. 6 is a graph illustrating the variance of internal resistance of the cells of a traditional battery pack of a vehicle.

Referring now to FIG. 6 a graph 600 illustrating the variance of internal resistance of the cells of a traditional battery pack of a vehicle is shown. Traditional battery packs are assembled by grouping random battery cells from a lot of battery cells. As a result, as shown in the graph 600, the variance of internal resistance of the battery cells each group is representative of the overall variance of the lot of battery cells. In contrast, by assembling a battery pack using the methods and systems disclosed herein the variance of internal resistance of the battery cells of group of a battery pack can be significantly reduced as shown in FIG. 7.

Figure 7:
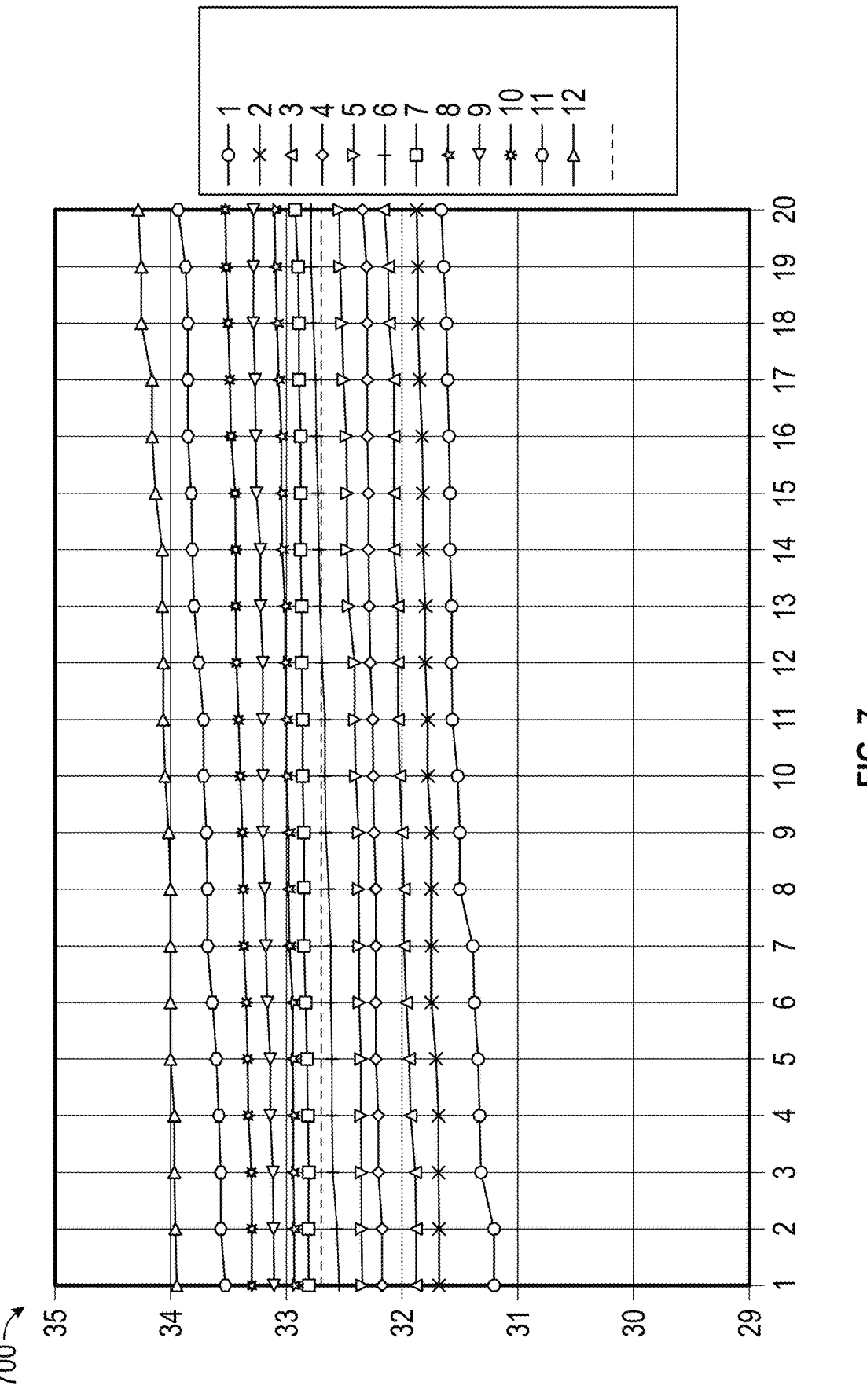
FIG. 7 is a graph illustrating the variance of internal resistance of the cells of a battery pack of a vehicle in accordance with one or more embodiments of the present disclosure.

FIG. 7 is a graph 700 illustrating the variance of internal resistance of the cells of a battery pack of a vehicle in accordance with one or more embodiments of the present disclosure. As shown in the graph 700, the battery pack includes twelve groups of twenty battery cells. Each of the battery cells has an internal resistance level and the battery cells are separated into groups based on their internal resistance level. For example, a maximum internal resistance level of the battery cells for group 1 is less than the minimum internal resistance level of the battery cells for group 2. Likewise, the maximum internal resistance level of the battery cells for group 2 is less than the minimum internal resistance level of the battery cells for group 3. In exemplary embodiments, each group of battery cells are connected to each other in parallel and the groups of battery cells are connected to each other in series.

Figure 8:
FIG. 8 is a graph illustrating the internal resistance of the cells of a battery pack of a vehicle in accordance with one or more embodiments of the present disclosure.
Figure 8:
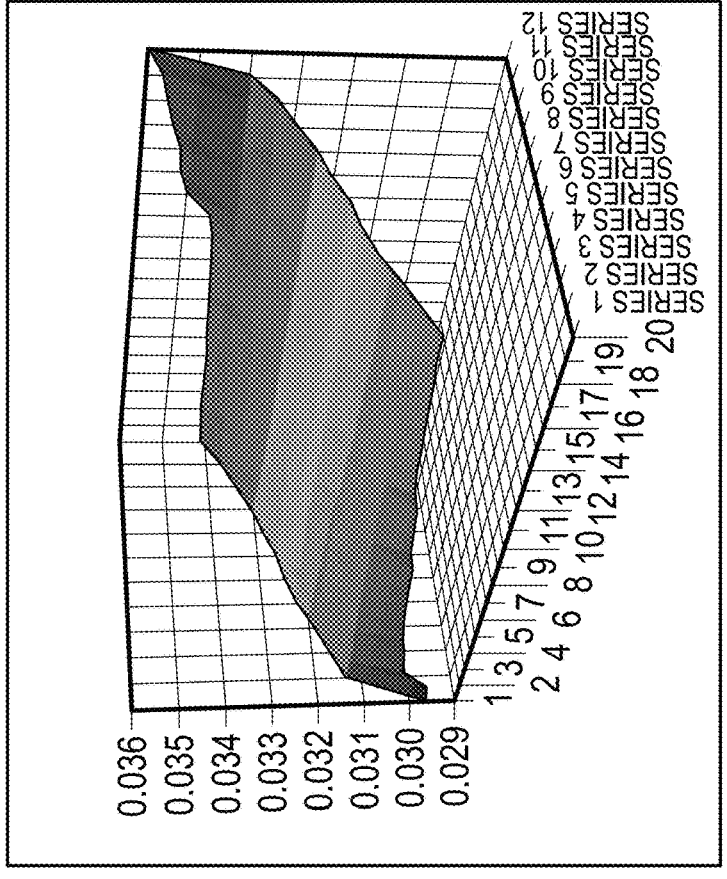

In exemplary embodiments, once the internal resistance of the battery cells have been measured, the battery cells have been ranked and sorted into groups, the battery module can be built using multiple cell arrangements. One such arrangement is a rank-ordered configuration where each of the cell groups is placed into the battery pack in order of increasing internal resistance, as shown in FIG. 8. Another arrangement is a temperature-ordered configuration where the cell group with the highest internal resistance is placed in the center of the battery pack, as shown in FIG. 9

FIG. 8 is three-dimensional graph 800 illustrating the internal resistance of the cells of a battery pack of a vehicle in accordance with one or more embodiments of the present disclosure. As shown in the graph 800, each of the groups of cells includes twenty battery cells and the groups were formed and placed in the battery pack in increasing order of internal resistance. In this configuration, the internal resistance of the battery cells increases from one side of the battery pack to the other.

Figure 9:
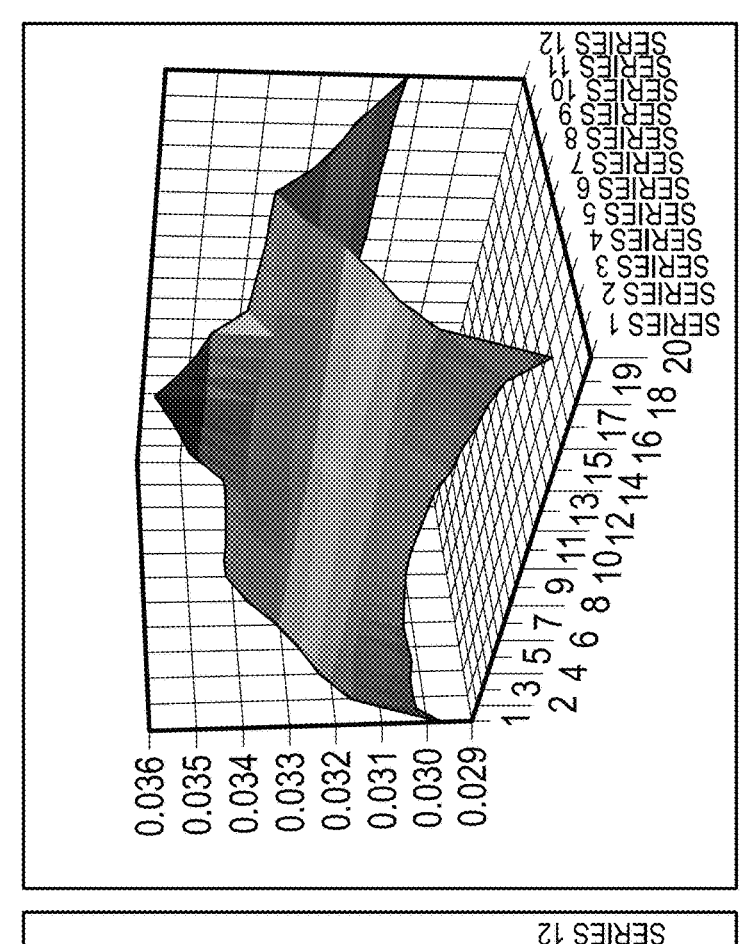
FIG. 9 is a graph illustrating the internal resistance of the cells of a battery pack of a vehicle in accordance with one or more embodiments of the present disclosure.

FIG. 9 is three-dimensional graph 900 illustrating the internal resistance of the cells of a battery pack of a vehicle in accordance with one or more embodiments of the present disclosure. As shown in the graph 900, the cell group with the highest internal resistance is placed in the center of the battery pack and the cell group with the lowest internal resistance is placed at an edge of the battery pack. The remaining cell groups are placed in order of decreasing internal resistance from the center of the battery pack to the edges of the battery pack. In exemplary embodiments, during use of the battery pack, as the battery charges and discharges, the battery pack heats up with the battery cells in the middle of the battery pack rising to higher temperatures compared to the cells around the boundaries. In general, when the temperature of a battery cell increases the internal resistance of the battery cell is reduced. Accordingly, during the use of the battery pack, the graph 900 will flatten out during operation, as the internal resistance of the centrally located battery cells decreases due to their increased temperature.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method for creating a battery pack for a vehicle, the method comprising:
   receiving a plurality of battery cells;
   measuring an internal resistance level for each of the plurality of battery cells;
   creating, based at least in part on the internal resistance level for each of the plurality of battery cells, a plurality of groups from the plurality of battery cells;
   connecting each of the plurality of battery cells in each of the plurality of groups in parallel; and
   connecting each of the plurality of groups in series, wherein creating the plurality of groups from the plurality of battery cells includes ordering the plurality of battery cells by the internal resistance level for each of the plurality of battery cells and selecting a number of adjacently ranked battery cells as a group.

2. The method of claim 1, wherein at least one of the plurality of battery cells is not included in any of the plurality of groups.

3. The method of claim 2, wherein the at least one of the plurality of battery cells includes a battery cell of the plurality of battery cells having a highest internal resistance level and a battery cell of the plurality of battery cells having a lowest internal resistance level.

4. The method of claim 1, wherein the plurality of groups from the plurality of battery cells are created such that a standard deviation of the internal resistance level for each of the plurality of groups is minimized.

5. The method of claim 1, wherein each of the plurality of groups includes a same number of battery cells.

6. The method of claim 1, wherein creating a group of the plurality of groups includes placing the plurality of battery cells corresponding to the group adjacent to one another.

7. A method for creating a battery pack for a vehicle, the method comprising:
   receiving a plurality of battery cells;
   measuring an internal resistance level for each of the plurality of battery cells;
   creating, based at least in part on the internal resistance level for each of the plurality of battery cells, a plurality of groups from the plurality of battery cells;
   connecting each of the plurality of battery cells in each of the plurality of groups in parallel;
   connecting each of the plurality of groups in series; and
   placing a group of the plurality of groups that has a highest internal resistance in a center of the battery pack.

8. The method of claim 7, wherein at least one of the plurality of battery cells is not included in any of the plurality of groups.

9. The method of claim 8, wherein the at least one of the plurality of battery cells includes a battery cell of the plurality of battery cells having a highest internal resistance level and a battery cell of the plurality of battery cells having a lowest internal resistance level.

10. The method of claim 7, wherein the plurality of groups from the plurality of battery cells are created such that a standard deviation of the internal resistance level for each of the plurality of groups is minimized.

11. The method of claim 7, wherein each of the plurality of groups includes a same number of battery cells.

12. The method of claim 7, wherein creating a group of the plurality of groups includes placing the plurality of battery cells corresponding to the group adjacent to one another.

13. A method for creating a battery pack for a vehicle, the method comprising:
   receiving a plurality of battery cells;
   measuring an internal resistance level for each of the plurality of battery cells;
   creating, based at least in part on the internal resistance level for each of the plurality of battery cells, a plurality of groups from the plurality of battery cells;
   connecting each of the plurality of battery cells in each of the plurality of groups in parallel;
   connecting each of the plurality of groups in series; and
   placing a group of the plurality of groups that has a lowest internal resistance at an edge of the battery pack.

14. The method of claim 13, wherein at least one of the plurality of battery cells is not included in any of the plurality of groups.

15. The method of claim 14, wherein the at least one of the plurality of battery cells includes a battery cell of the plurality of battery cells having a highest internal resistance level and a battery cell of the plurality of battery cells having a lowest internal resistance level.

16. The method of claim 13, wherein the plurality of groups from the plurality of battery cells are created such that a standard deviation of the internal resistance level for each of the plurality of groups is minimized.

17. The method of claim 13, wherein each of the plurality of groups includes a same number of battery cells.

18. The method of claim 13, wherein creating a group of the plurality of groups includes placing the plurality of battery cells corresponding to the group adjacent to one another.

\* \* \* \* \*